(12) United States Patent
Graham et al.

(10) Patent No.: US 9,476,779 B2
(45) Date of Patent: Oct. 25, 2016

(54) SENSOR WITH AN EMBEDDED THERMISTOR FOR PRECISE LOCAL TEMPERATURE MEASUREMENT

(71) Applicant: Robert Bosch GmbH, Stuttgart (DE)

(72) Inventors: Andrew Graham, Redwood City, CA (US); Ando Feyh, Palo Alto, CA (US); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 398 days.

(21) Appl. No.: 14/096,306

(22) Filed: Dec. 4, 2013

(65) Prior Publication Data

US 2014/0169405 A1 Jun. 19, 2014

Related U.S. Application Data

(60) Provisional application No. 61/736,838, filed on Dec. 13, 2012.

(51) Int. Cl.
*G01K 7/00* (2006.01)
*G01K 7/22* (2006.01)
*B81B 7/00* (2006.01)

(52) U.S. Cl.
CPC .............. *G01K 7/226* (2013.01); *B81B 7/008* (2013.01); *B81B 7/0087* (2013.01); *B81B 2201/0264* (2013.01); *B81B 2207/03* (2013.01); *Y10T 29/49085* (2015.01)

(58) Field of Classification Search
USPC ........................................................ 374/183
See application file for complete search history.

(56) References Cited

U.S. PATENT DOCUMENTS 5,830,372 A 11/1998 Hierold
7,270,868 B2 * 9/2007 Pannek ............... B81C 1/00595
257/415

(Continued)

FOREIGN PATENT DOCUMENTS

WO 2009108230 A1 9/2009

OTHER PUBLICATIONS

International Search Report and Written Opinion corresponding to PCT Application No. PCT/US2013/074051, mailed Jun. 18, 2014 (11 pages).

*Primary Examiner* — Mirellys Jagan
(74) *Attorney, Agent, or Firm* — Maginot Moore & Beck LLP

(57) ABSTRACT

A resistive temperature sensor (thermistor) for a microelectromechanical system (MEMS) device provides local temperatures of MEMS sensors and other MEMS devices for temperature compensation. Local accurate temperatures of the sensors and other devices provide for temperature compensation of such sensors or devices. By incorporating the thermistor structure into a MEMS device, an accurate temperature is sensed and measured adjacent to or within the structural layers of the device. In one embodiment, the thermistor is located within a few micrometers of the primary device.

8 Claims, 6 Drawing Sheets

(56) References Cited

U.S. PATENT DOCUMENTS

| | | | | |
|---|---|---|---|---|
| 8,608,378 B2* | 12/2013 | Ishida | | G01K 1/18 374/161 |
| 8,644,693 B2* | 2/2014 | Huang | | G01N 25/18 219/490 |
| 9,022,644 B1* | 5/2015 | Arft | | G01K 13/02 374/116 |
| 2006/0258040 A1* | 11/2006 | Chen | | H01C 7/008 438/54 |
| 2008/0163687 A1* | 7/2008 | Kranz | | B81C 1/00246 73/514.32 |
| 2010/0219733 A1 | 9/2010 | Wan et al. | | |
| 2012/0119872 A1* | 5/2012 | Leung | | H01C 17/265 338/25 |
| 2012/0125747 A1* | 5/2012 | Chu | | H01P 1/127 200/181 |
| 2013/0010826 A1* | 1/2013 | Le Neel | | G01N 33/49 374/142 |
| 2013/0015743 A1* | 1/2013 | Tsai | | H02N 1/00 310/300 |
| 2015/0282341 A1* | 10/2015 | Hu | | H05K 1/115 361/750 |

\* cited by examiner

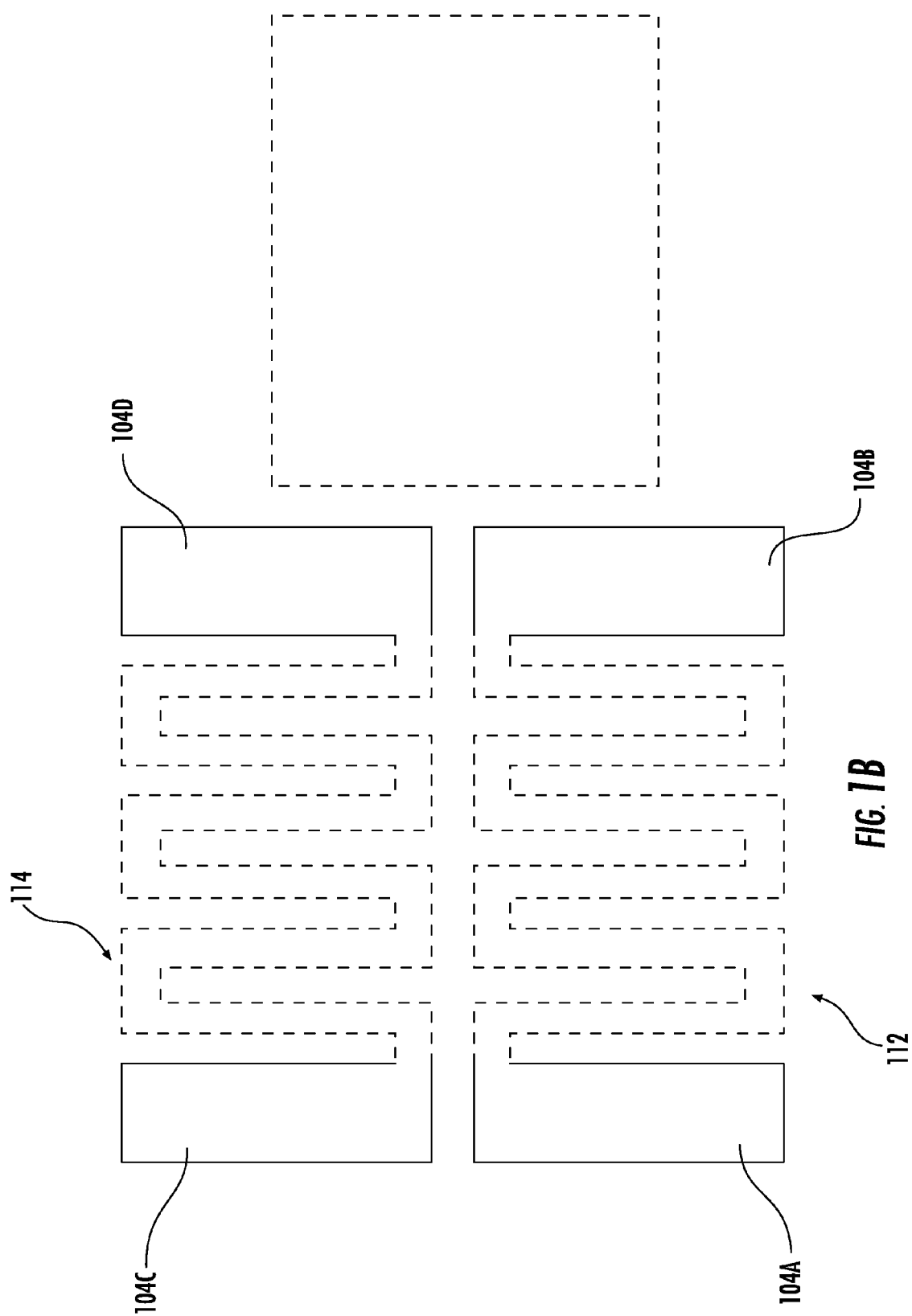

SENSOR WITH AN EMBEDDED THERMISTOR FOR PRECISE LOCAL TEMPERATURE MEASUREMENT

This application claims priority to U.S. Provisional Patent Application Ser. No. 61/736,838 entitled "Sensor With An Embedded Thermistor for Precise Local Temperature Measurement" by Graham et al., filed Dec. 13, 2012, the disclosure of which is herein incorporated by reference in its entirety.

TECHNICAL FIELD

This disclosure relates to microelectromechanical system (MEMS) devices and more particularly to MEMS devices with temperature dependent response characteristics.

BACKGROUND

In general, for nearly every type of sensor, the temperature of the sensor affects the sensor's performance including the sensing capability, the sensor output, or both. While in some sensor implementations, this influence can be deemed negligible, and therefore ignored, for many precision sensors changes to the sensor performance resulting from the effects of temperature can be a critical performance consideration. In the field of MEMS sensors, including micromachined sensors, for instance, this temperature effect is most often, but not exclusively, seen at the sensor output. In many instances, temperature changes adversely affect the material properties of the sensor with resulting sensor inaccuracy.

In an attempt to compensate for these inaccuracies, many temperature compensation techniques have been developed. The simplest among these is the use of a temperature sensor whose output can be used to compensate for the output of the main or primary sensor. For instance, a temperature sensor can be used to determine the temperature of a pressure sensor (the primary sensor) being used to detect pressures. Most temperature sensors used for such purposes, however, suffer from an inability to provide an accurate temperature of the primary sensor or an inability to provide a desired resolution of the temperature of the primary sensor. The location of the temperature sensor with respect to the primary sensor can also lead to inaccurate sensing of the temperature of the primary sensor.

Temperature sensors are available with a wide range of performance characteristics, including accuracy and resolution. Neglecting the practical aspects of implementing such sensors, the most common problem with such sensors is the inability to place the temperature sensor in sufficiently close proximity to the primary sensor so as to leverage the temperature sensor's performance. Even moderate distances between the temperature sensor and the primary sensor can lead to a thermal lag where thermal lag is defined as a time delay between the occurrence of an actual or real temperature and the measured temperature. Thermal gradients (slightly different temperatures occurring across the location of the sensor) can occur and the temperature across a gradient often cannot be accurately determined. In addition, many implementations of localized temperature sensors can suffer from relatively poor resolution.

Consequently, there is a need for determining the temperature at a primary sensor with improved accuracy and/or resolution. There is a further need to provide a primary sensor having improved performance.

SUMMARY

The present disclosure relates to the field of temperature sensors for microelectromechanical systems and devices, including micromachined systems and devices, configured to sense a wide variety of conditions including pressure, sound, and environmental conditions such as humidity. MEMS devices include sensors and actuators typically formed on or within a substrate such as silicon. The present disclosure provides an accurate determination of local temperatures of the primary sensor to provide temperature compensation of such sensors.

Devices other than sensors also benefit from the use of the described temperature sensor when the devices are affected by temperature. For instance, a micromachined motor can perform differently under different temperature conditions. By knowing the operating characteristics of the motor and the effect of temperature on those characteristics, the operation of the motor is optimized by taking into account the measured temperature. Micromachined accelerometers also benefit.

By incorporating a thermistor (resistive temperature sensor) into the devices described herein, the operation of the devices is improved or optimized. Accurate temperature sensing is achieved by measuring the temperature adjacent to or within the same structural layer as the primary sensor or within a few micrometers away from the structural layer or location of the primary sensor.

In accordance with one embodiment of the present disclosure, there is provided a method of manufacturing a microelectromechanical system (MEMS) device. The method of manufacturing includes forming a dielectric layer, forming a silicon layer on the dielectric layer, forming a thermistor structure in the silicon layer, forming a device structure in one of the dielectric layer and the silicon layer, and forming a plurality of contacts on the silicon layer, the plurality of contacts being subtended by the thermistor structure.

In another embodiment of the present disclosure there is provided a microelectromechanical system (MEMS) device. The MEMS device includes a substrate, a silicon layer having a surface, and a first dielectric layer disposed between the substrate and the silicon layer. A thermistor structure is disposed in the silicon layer and being configured to extend from the dielectric layer to the surface of the silicon layer. A device structure is disposed in one of the silicon layer and the dielectric layer.

In still another embodiment of the present disclosure, there is provided a microelectromechanical system (MEMS) sensor for sensing a device condition of a MEMS device. The MEMS sensor includes a functional layer formed of silicon including the MEMS device and a resistive structure disposed in the functional layer adjacent to the MEMS device. The resistive structure includes a plurality of dielectric spacers disposed in the functional layer to define the resistive structure.

BRIEF DESCRIPTION OF DRAWINGS

FIG. 1B is a schematic top plan view of a thermistor embedded in a wafer substrate wherein the thermistor is disposed proximate to a pressure sensor similar to the thermistor of FIG. 1A.

DESCRIPTION

Figure 1A:
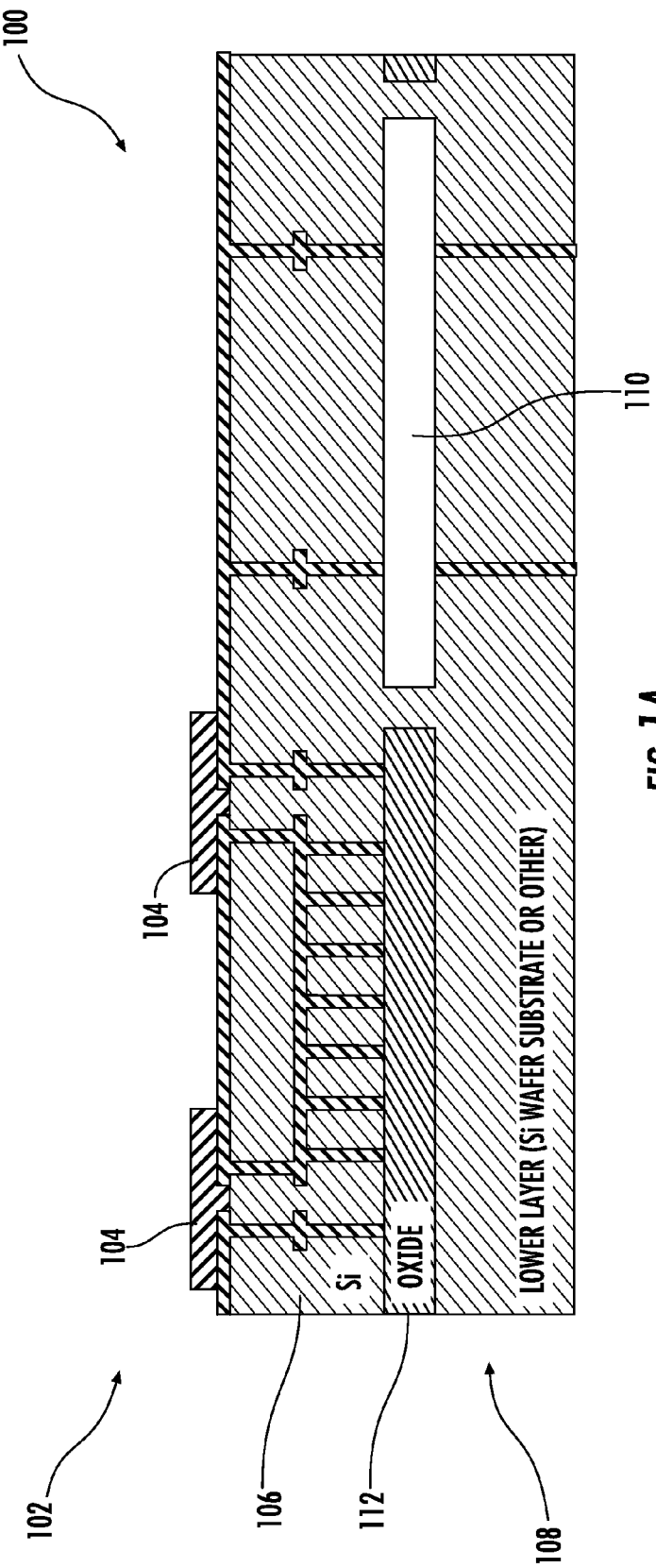
FIG. 1A is a schematic cross-sectional view of a thermistor embedded in a wafer substrate wherein the thermistor is disposed proximate to a pressure sensor.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one of ordinary skill in the art to which this disclosure pertains.

FIG. 1A depicts one embodiment of a layout of a MEMS sensor 100 including an embedded MEMS temperature dependent resistor (thermistor) 102. The thermistor 102 includes a plurality of contacts 104. Two contacts are illustrated. The thermistor 102 includes a resistive structure 106 having a temperature dependent resistance. The resistive structure is disposed within a substrate 108 and is coupled to the contacts 104. The substrate, in different embodiments, includes a wafer substrate, including silicon or other known substrate materials. The thermistor 102 is formed according to known techniques for forming MEMS devices and systems.

The MEMS thermistor 102 is embedded in the substrate 108 and is disposed adjacently to a pressure sensor 110. Both the thermistor 102 and the pressure sensor 110 are formed within the same substrate and adjacently with respect to one another. As illustrated, the thermistor 102 and sensor 110 are generally aligned along a horizontal plane of the substrate. By forming both devices within a common substrate and within close proximity to one another, accurate temperature sensing of the temperature of the pressure sensor 110 is provided. The pressure sensor 110 generates a value of pressure, for instance, if embodied as a strain gauge, and the thermistor 102 provides an accurate operating temperature of the pressure sensor 110. If the output pressure signal of the pressure sensor 110 changes with respect to an operating temperature of the sensor 110, the output signal, in different embodiments, is adjusted based on the measured temperature provided by the thermistor 102. In this way, an improved and highly accurate MEMS sensor 100 including the pressure sensor 110 is provided. An oxide layer 112 is disposed beneath the resistive structure 106. While an oxide layer is described with respect to the embodiments disclosed herein, other dielectric materials, in different embodiments, are used and include nitride, air, and a vacuum.

FIG. 1B is a schematic top plan view of the thermistor embedded in the wafer substrate wherein the thermistor is disposed proximate to a pressure sensor similar to the thermistor of FIG. 1A. As seen in FIG. 1B, four electrical contacts 104A, 104B, 104C, and 104D are illustrated. The contacts 104A and 104B are connected by a resistive structure 112. The contacts 104C and 104D are connected by a resistive structure 114. The silicon substrate defines the resistive structures 112 and 114 and the areas or gaps between the resistive structure are defined by a dielectric material (spacer) as later described herein. To provide a thermistor, a complete resistive circuit is provided by electrically coupling the contact 104A to contact 104C or by electrically coupling the contact 104B to contact 104D. The contacts which not coupled together provide the electrical contact points used to determine the resistance of the thermistor during operation.

Figure 2:
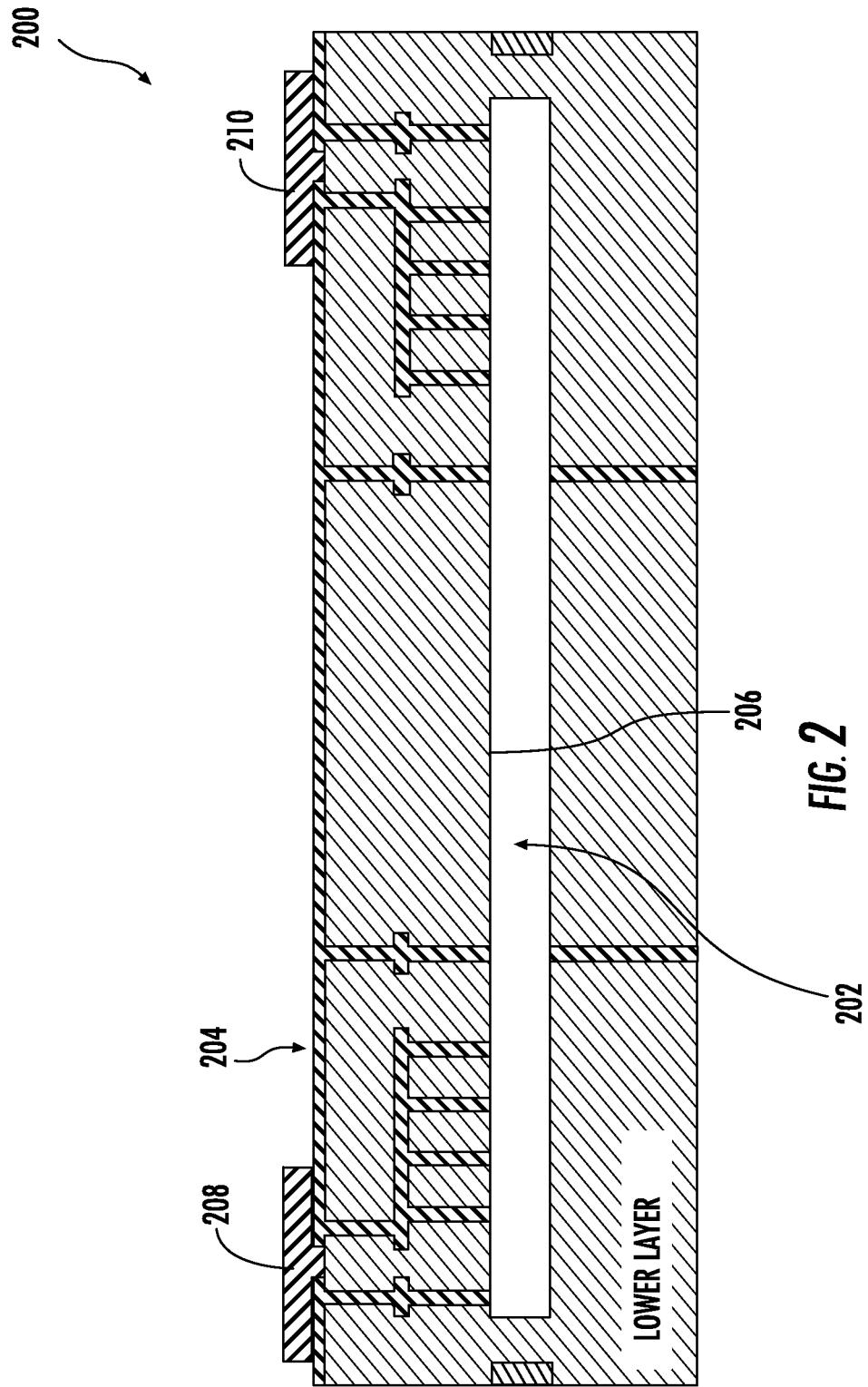
FIG. 2 is a schematic cross-sectional view of a thermistor embedded in a membrane surrounding a pressure sensor/microphone.

FIG. 2 illustrates a MEMS sensor 200 including an embedded thermistor 204 incorporated within a membrane 202. Unlike the embodiment of FIG. 1A, the embodiment of FIG. 2 includes a thermistor 204 embedded in the substrate or membrane surrounding the pressure sensor electrode 206. In the illustrated embodiment, the temperature signal provided by the thermistor 204 is indicative of the temperature at a movable portion of the device 202. The thermistor 204 includes a first contact 208 and a second contact 210 to provide for electrical coupling of the output signal of the thermistor 204 to other devices or systems. As illustrated, the contact 208 is disposed at generally one end of the device 200 and the contact 210 is disposed generally at a second end of the device 200. In some embodiments and depending on the type of primary device being sensed, a thermistor surrounding the primary device provides a more accurate or at least a more desirable temperature value. The configurations of the thermistor and its structure of location with respect to the primary device, such as those of FIG. 1A and FIG. 2, are selected according to the type of primary device being sensed and a desired accuracy and/or resolution. It is also possible to have the electrical contacts 208, 210 on the side of or besides the sensor membrane. Thereby the sensor membrane is not affected by the metal of those contacts.

Figure 3:
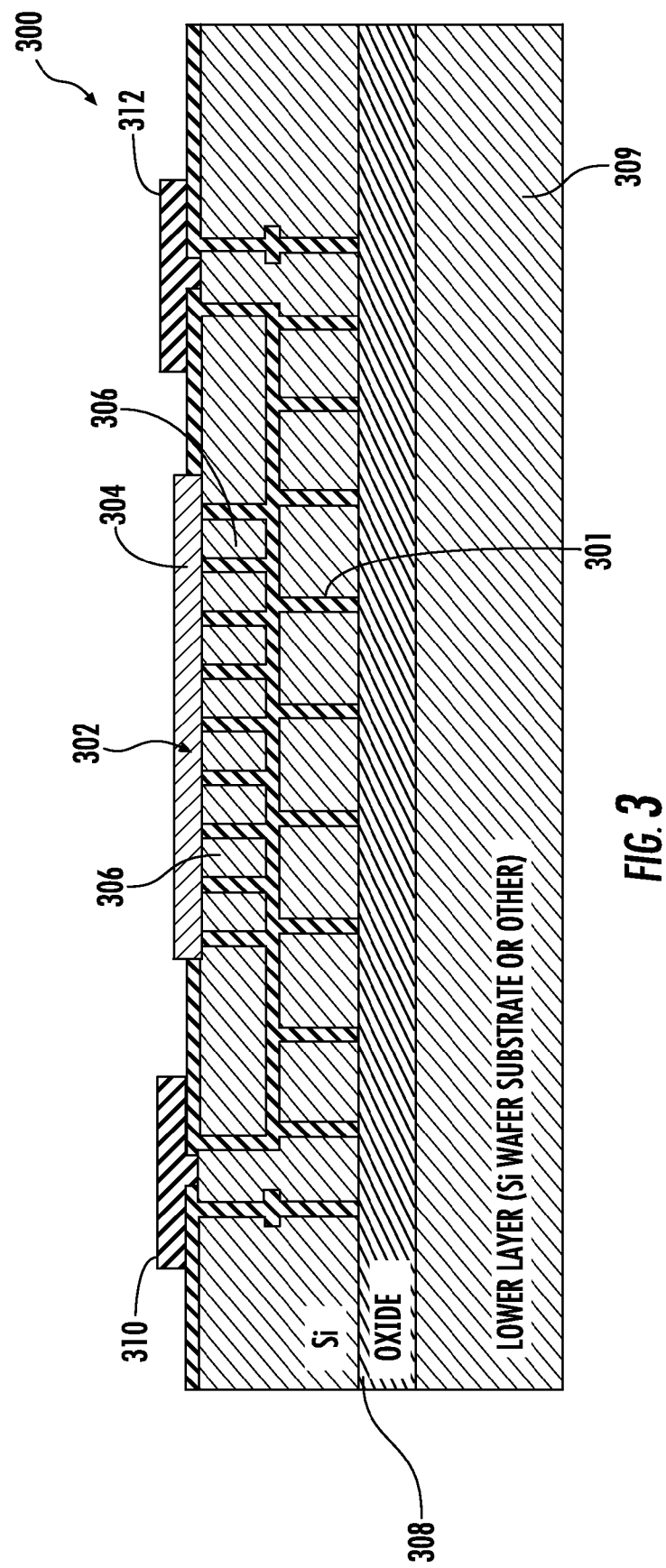
FIG. 3 is a schematic cross-sectional view of a thermistor embedded in a wafer substrate and subtending a humidity sensor.

FIG. 3 illustrates a MEMS sensor 300 including an embedded thermistor 301 disposed underneath, or subtending, a humidity sensor 302. The humidity sensor 302 is formed on a top surface of the substrate and includes a humidity sensitive polymer 304 including electrodes 306. As shown, electrodes 306 are located in close proximity to the thermistor 301 which is located above an oxide layer 308 and substrate 309. The electrodes are configured for an interdigitated capacitive humidity sensor. A first contact 310 and a second contact 312 are disposed on the surface of the silicon wafer and at each of the ends of the thermistor 301. In this embodiment, it is seen that the primary sensor is disposed at, on, or above a top surface of the wafer substrate and the thermistor is embedded or formed within the wafer substrate. As illustrated, there is an extreme proximity between the primary sensor 302 and the embedded thermistor 301.

FIGS. 4-11 depict a process for forming a MEMS sensor such as the sensor of FIG. 1A. While the sensor 100 of FIG. 1A includes a structure including an illustrated number of pressure sensor electrodes, any number of electrodes is possible.

Figure 4:
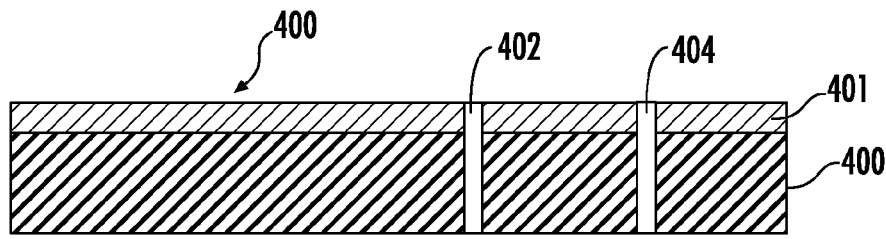
FIGS. 4-11 depict one embodiment of a procedure used to form a thermistor disposed proximately to a pressure sensor.
Figure 5:
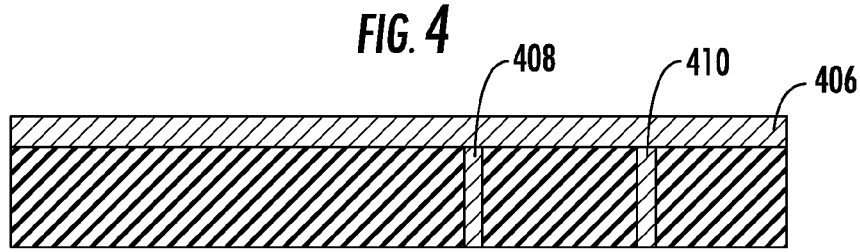
Figure 6:
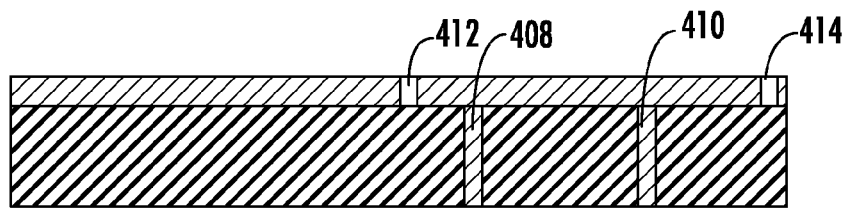

Referring initially to FIG. 4, a silicon wafer with a top layer of silicon 400 (either formed within the substrate or within the device layer of an SOI-wafer, or within a layer of poly-crystalline silicon deposited on top of an insulating/oxide film on a silicon wafer) is provided to form the thermistor 102 and sensor 110 of FIG. 1A. The silicon layer 400 is etched using a photoresist layer 401 to form trenches 402 and 404 which define a lower electrode. Once the trenches 402 and 404 have been formed, an oxide layer 406 (FIG. 5) is deposited on the upper surface of wafer 400. The oxide deposition fills in the trenches 402 and 404 to form oxide columns 408 and 410. The oxide layer 406 is then etched using a photoresist layer (not shown) to form a trench 412 and a trench 414 in the oxide layer 406 as illustrated in FIG. 6.

Figure 7:
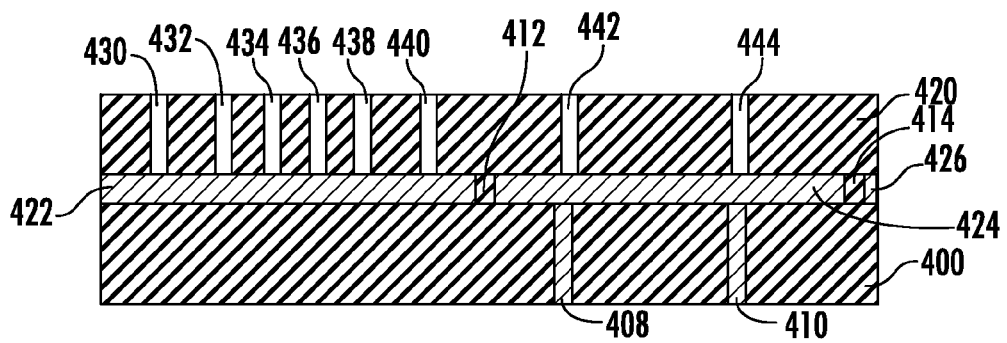
Figure 8:
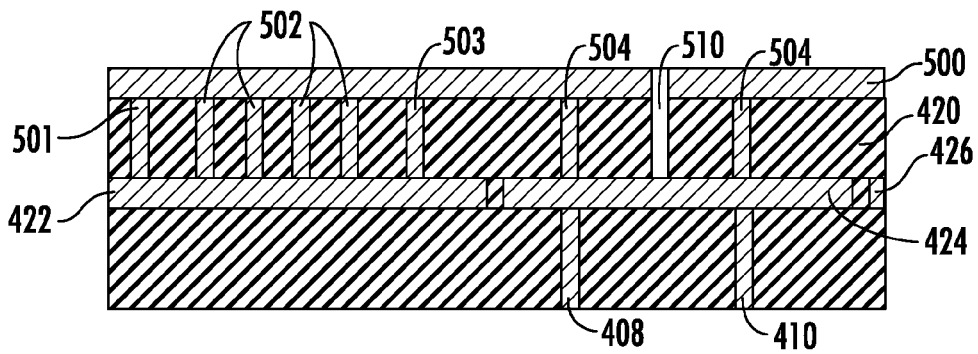

As shown in FIG. 7, a silicon layer 420 is deposited on the oxide layer 406. The silicon layer 420 when deposited also fills in the trenches 412 and 414 (which act as etch stops)

such that the silicon layer 400 beneath the oxide layer 406 is coupled to the silicon layer 420 through the silicon filled trenches 412 and 414. The oxide layer 406, at this step of the process, includes a first portion 422 separated from a second portion 424 by the silicon filled trench 412 and a third portion 426 separated from the second portion 424 by the silicon filled trench 414.

Once the silicon layer 420 is formed, a photoresist layer (not shown) is provided and used to form a plurality of trenches 430, 432, 434, 436, 438, and 440 each of which extends to the first portion 422 of the oxide layer 406. In addition, a trench 442 and 444 are formed to extend to the second portion 424 of the silicon oxide layer 406.

Following the etch of the silicon layer 420, each of the trenches disposed therein are filled through the deposition of nitride to the top surface of the silicon layer 420. A resulting nitride layer 500 is formed. Nitride columns 501, 502, 503 are formed and disposed between the first portion 422 of the silicon 406 and the layer 500. Nitride columns 504 are disposed between the second portion 424 and the layer 500. Once the trenches 501, 502, 503, and 504 are filled, the surface of the nitride layer 500 is planarized and a photoresist layer (not shown) is used to form a trench 510. The trench 510 extends from the nitride layer 500 through the silicon layer 402 and to the portion 424.

Figure 9:
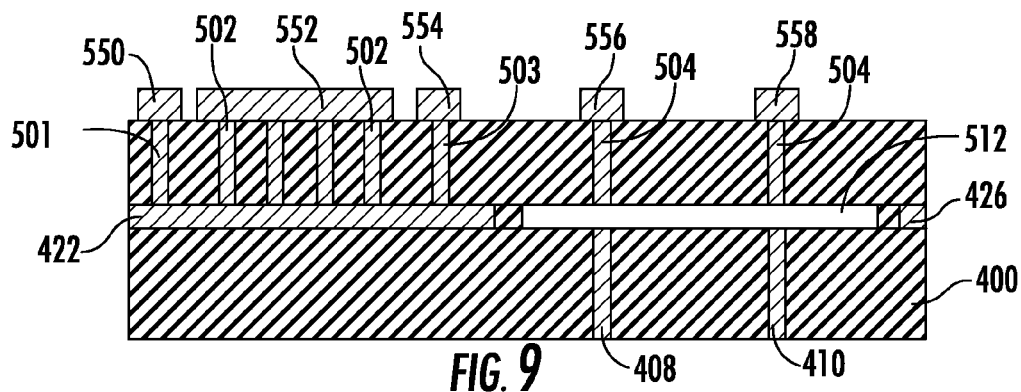

After forming the nitride layer 500, a photoresist layer (not shown) is provided and used to form a plurality of lateral extensions from the layer 500. Referring to FIG. 9, a first lateral extension 550 is disposed above the column 501. A second lateral extension 552 is disposed above the columns 502 and a third lateral extension 554 is disposed above the lateral extension 503. Additional lateral extensions 556 and 558 are disposed above columns 504. The plurality of lateral extensions is patterned prior to the formation of a cavity 512. Cavity 512 is formed using e.g. gas phase HF etching through the trench 510 to remove the oxide portion 424. In one embodiment the procedure is as follows: the lateral extensions 550, 552, 554, 556 and 558 are formed; trench 510 is formed; cavity 512 is formed by gas phase HF etching; and a silicon layer 600 is deposited as illustrated in FIG. 10.

Figure 10:
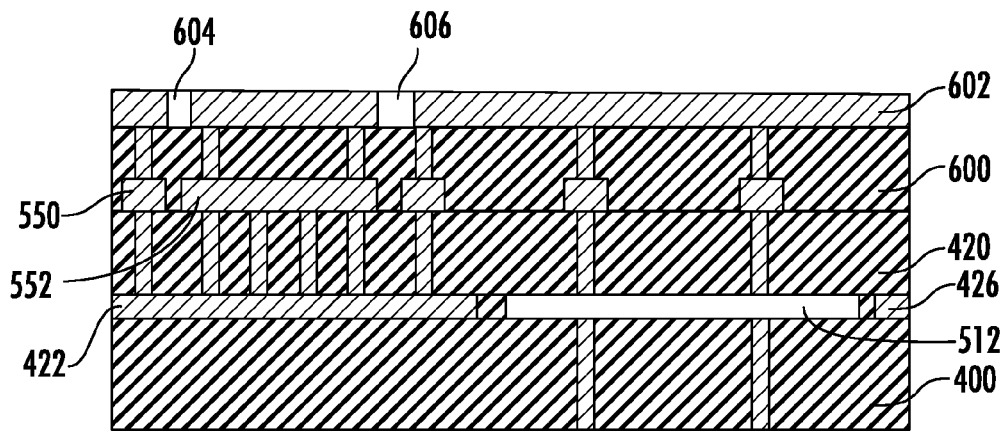
Figure 11:
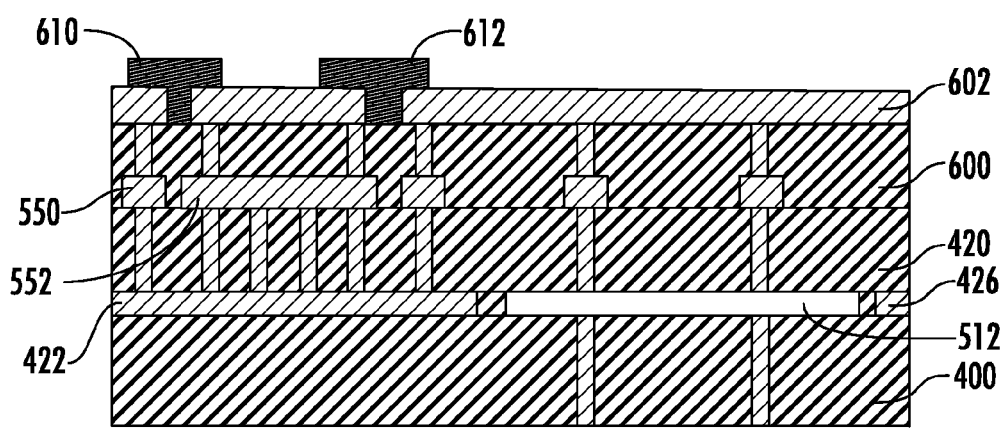

Referring to FIG. 10, once the lateral extensions are formed, the silicon layer 600 is formed above the silicon layer 420. At the same time as depositing the silicon layer 600, the trench 510 is refilled with silicon. After forming the silicon layer 600, an oxide layer 602 is deposited on the surface of the silicon layer 600 which is then etched with a photoresist layer (not shown) to form a trench 604 and 606. After forming of the trenches 604 and 606, a metal contact layer is formed on the surface of the oxide layer 602 and then etched to form a contact 610 and a contact 612. The contacts 610 and 612 correspond to the contacts 104 of FIG. 1A.

Those of skill in the art will recognize that the process described with reference to FIGS. 4-11 in other embodiments is modified to provide a variety of configurations designed for the particular embodiment.

Because the spacers are located within the device layer, the spacers (trenches, columns and lateral extensions) are used to define the thermistors of the present disclosure. By locating the thermistor within the device layer, the thermistor, in one embodiment, is placed adjacent to a primary sensor or other devices using known techniques. Consequently, each of the described embodiments including the pressure sensor, microphone, and humidity sensor, in different embodiments, incorporates the described process of forming the thermistor in a device layer.

The present disclosure includes a MEMS thermistor (resistive temperature sensor) embedded in a same functional material as the functional material of a MEMS primary device, such as a sensor. A minimal distance is disposed between the thermistor and the primary device. By fabricating the thermistor within the same functional material as the primary sensor, the temperature sensor in various embodiments is located adjacent to the primary sensor at a number of predetermined locations, including immediately adjacent to, on top of, below, or within the primary sensor. MEMS fabrication techniques in various embodiments are used to place the thermistor adjacent to or within the primary device. In some embodiments, a dielectric spacer layer is used which provides electrical isolation between two sensors. The distance between a thermistor and an adjacent device in some embodiments is less than 10 micrometers. The temperature sensor in various embodiments is implemented with a number of MEMS primary sensors including pressure sensors, microphones, and humidity sensors, all of which benefit from accurate temperature information. The temperature of other types of MEMS devices, in different embodiments, is also sensed.

The use a MEMS temperature sensor offers the following advantages:

(1) High resolution temperature sensing (temperatures on the order of hundreds of micro-Kelvins) of the primary sensor material.

(2) Temperature measurement of the primary sensor material within a few micrometers or less of the primary sensor or device. In some implementations, the temperature sensor is embedded into or located within the structure of the primary sensor.

(3) In some implementations, the temperature sensor is fabricated as part of the primary sensor and during an existing fabrication process for the primary sensor.

(4) Due to the high precision and extremely close proximity of the temperature measurement, temperature compensation of the primary sensor is unparalleled in terms of resolution, accuracy, and thermal lag.

(5) Decoupling of the temperature and primary sensor's electrical signals while maintaining excellent thermal coupling.

The sensors and devices which include the thermistor of the present disclosure can be embodied in a number of different types and configurations of sensors. The following embodiments are provided as examples and are not intended to be limiting.

In one embodiment, there is provided a temperature sensitive resistor (thermistor) embedded in the structural layer of a microelectromechanical system (MEMS) device or sensor.

Another embodiment includes the thermistor of embodiment 1 provided by use of doped silicon electrically isolated from a MEMS device or sensor by a dielectric spacer including one of an oxide, a nitride, air, and a vacuum.

In still another embodiment, the thermistor of embodiment 1 is disposed directly beside, on top of, or underneath a MEMS device or sensor.

In an additional embodiment, there is provided the thermistor of embodiment 1 co-fabricated with other MEMS sensors.

Another embodiment includes the thermistor of embodiment 1 disposed within the membrane of a pressure sensor or microphone.

An additional embodiment includes the thermistor of embodiment 1 disposed adjacent to or directly surrounding the membrane of a pressure sensor or microphone.

One additional embodiment includes the thermistor of embodiment 1 disposed directly underneath or embedded directly underneath a humidity sensor within the same functional layer of a substrate.

One additional embodiment includes the thermistor of embodiment 1 disposed directly underneath or embedded directly underneath a gas sensor within the same functional layer of a substrate.

A further embodiment includes a thermistor of embodiment 1 disposed beside or embedded directly beside a humidity sensor.

In still an additional embodiment, the thermistor of embodiment 1 is fabricated as an interdigitated structure with a humidity sensor.

In still another embodiment, the thermistor of embodiment 1 is disposed in a buried portion of a functional layer with the exposed portion being used as a shielding layer.

While the disclosure has been illustrated and described in detail in the drawings and foregoing description, the same should be considered as illustrative and not restrictive in character. In each of the described embodiments, fabrication of the thermistor structures and primary sensors is achieved using known fabrication techniques and methods. The thermistors, in different embodiments, are incorporated adjacent to and within a wide range of devices. It is understood that only the preferred embodiments have been presented and that all changes, modifications and further applications that come within the spirit of the disclosure are desired to be protected.

What is claimed is:

1. A microelectromechanical system (MEMS) device comprising:
   a substrate;
   a silicon layer having an upper surface;
   a first dielectric layer disposed between the substrate and the silicon layer;
   a thermistor structure disposed in the silicon layer, the thermistor structure being configured to extend from the dielectric layer to the upper surface of the silicon layer; and
   a device structure disposed in one of the silicon layer and the dielectric layer.

2. The MEMS device of claim 1 wherein the thermistor structure comprises a resistive structure including a plurality of dielectric columns extending from the dielectric layer toward the surface of the silicon layer, wherein each of the plurality of dielectric columns is separated from another of the plurality of dielectric columns by a portion of the silicon layer.

3. The MEMS device of claim 2 further comprising a plurality of contacts disposed on the silicon layer, each of the plurality of contacts being subtended by the silicon layer and at least one of the plurality of dielectric columns.

4. The MEMS device of claim 3 wherein the silicon layer includes a first silicon layer and a second silicon layer, and further including a second dielectric layer disposed between the first and second silicon layers, the second dielectric layer being connected to at least two of the plurality of the dielectric columns.

5. The MEMS device of claim 4 further comprising a third dielectric layer laterally disposed on the second silicon layer, wherein the plurality of dielectric columns extend from the first dielectric layer to the third dielectric layer.

6. The MEMS device of claim 5 wherein the third dielectric layer includes a plurality of trenches configured to expose a surface of the second silicon layer and wherein the plurality of contacts contact the exposed surface of the second silicon layer.

7. A microelectromechanical system (MEMS) sensor for sensing a device condition of a MEMS device, the MEMS sensor comprising:
   a functional layer formed of silicon wherein the silicon includes the MEMS device; and
   a resistive structure disposed in the functional layer adjacent to the MEMS device, the resistive structure including a plurality of dielectric spacers disposed in the functional layer to define the resistive structure.

8. The MEMS sensor of claim 7, wherein the plurality of dielectric spacers are disposed in the functional layer to define the resistive structure such that the resistance of the resistive structure varies in response to a change in temperature.

* * * * *